(12) United States Patent
Suh et al.

(10) Patent No.: US 9,368,177 B2
(45) Date of Patent: Jun. 14, 2016

(54) MAGNETIC RESISTANCE STRUCTURE, METHOD OF MANUFACTURING THE MAGNETIC RESISTANCE STRUCTURE, AND ELECTRONIC DEVICE INCLUDING THE MAGNETIC RESISTANCE STRUCTURE

(71) Applicant: Samsung Electronics Co., Ltd., Suwon-Si, Gyeonggi-Do (KR)

(72) Inventors: Hwansoo Suh, Gunpo-si (KR); Insu Jeon, Incheon (KR); Min-woo Kim, Suwon-si (KR); Young-jae Song, Suwon-si (KR); Min Wang, Suwon-si (KR); Qinke Wu, Suwon-si (KR); Sung-joo Lee, Suwon-si (KR); Sung-kyu Jang, Suwon-si (KR); Seong-jun Jung, Suwon-si (KR)

(73) Assignees: Samsung Electronics Co., Ltd., Gyeonggi-do (KR); Sungkyunkwan University Foundation for Corporate Colaboration, Gyeonggi-do (KR)

( * ) Notice: Subject to any disclaimer, the term of this patent is extended or adjusted under 35 U.S.C. 154(b) by 0 days.

(21) Appl. No.: 14/282,470

(22) Filed: May 20, 2014

(65) Prior Publication Data

US 2015/0131371 A1     May 14, 2015

(30) Foreign Application Priority Data

Nov. 13, 2013   (KR) .................. 10-2013-0137885

(51) Int. Cl.
  *H01L 29/66*  (2006.01)
  *G11C 11/16*  (2006.01)
  (Continued)

(52) U.S. Cl.
  CPC ............. *G11C 11/161* (2013.01); *H01L 27/22* (2013.01); *H01L 27/222* (2013.01); *H01L 43/08* (2013.01); *H01L 43/12* (2013.01); *G11C 2213/35* (2013.01); *Y10T 428/30* (2015.01)

(58) Field of Classification Search
  None
  See application file for complete search history.

(56) References Cited

U.S. PATENT DOCUMENTS 5,616,370 A    4/1997   Okuno et al.
6,028,786 A    2/2000   Nishimura
(Continued)

FOREIGN PATENT DOCUMENTS

EP    0485129 A1    5/1992
EP    0875901 A2    11/1998
(Continued)

OTHER PUBLICATIONS

Yazyev et al., Magnetoresistive junctions based on epitaxial graphene and hexagonal boron nitride, Jul. 9, 2009, The American Physical Society, Physical Review B 80, pp. 035408-1-035408-5.*
(Continued)

*Primary Examiner* — Robert Bachner
*Assistant Examiner* — Molly Reida
(74) *Attorney, Agent, or Firm* — Harness, Dickey & Pierce, P.L.C.

(57) ABSTRACT

Provided are a magnetic resistance structure, a method of manufacturing the magnetic resistance structure, and an electronic device including the magnetic resistance structure. The method of manufacturing the magnetic resistance structure includes forming a hexagonal boron nitride layer, forming a graphene layer on the boron nitride layer, forming a first magnetic material layer between the boron nitride layer and the graphene layer according to an intercalation process; and forming a second magnetic material layer on the graphene layer.

15 Claims, 5 Drawing Sheets

(51) Int. Cl.
*H01L 43/08* (2006.01)
*H01L 43/12* (2006.01)
*H01L 27/22* (2006.01)

(56) References Cited

U.S. PATENT DOCUMENTS

| | | |
|---|---|---|
| 7,114,240 B2 | 10/2006 | Baseman et al. |
| 7,902,616 B2 | 3/2011 | Klostermann et al. |
| 8,189,302 B2 | 5/2012 | Gurney et al. |
| 8,227,842 B2 | 7/2012 | Marinero et al. |
| 8,338,825 B2 | 12/2012 | Kelber |
| 8,373,948 B2 | 2/2013 | Zeltser |
| 2002/0081778 A1* | 6/2002 | Inoue et al. ............... 438/122 |
| 2011/0149670 A1* | 6/2011 | Heo et al. ................ 365/225.5 |

FOREIGN PATENT DOCUMENTS

| | | |
|---|---|---|
| WO | WO-2005/050628 A1 | 6/2005 |
| WO | WO-2012-166562 A1 | 12/2012 |

OTHER PUBLICATIONS

K. H. Lee, et al. "Large-Scale Synthesis of High-Quality Hexagonal Boron Nitride Nanosheets for Large-Area Graphene Electronics"; Nano Letters, vol. 12, p. 714-718; 2012.

C. Hérold, et al. "Study of $FeCl_3$ and $CoCl_2$ graphite intercalation compounds reduced by heavy alkali metal vapour"; Microscopy Microanalysis Microstructures, vol. 2, p. 589-602; Dec. 1991.

V. Karpan, et al. "Ni(111)|graphene|h-BN junctions as ideal spin injectors"; Physical Review, vol. 84, No. 153406, p. 1-4; 2011.

M. Dresselhaus et al. "Intercalation compounds of graphite"; Advances in Physics, vol. 51, No. 1, p. 1-186; 2002.

S. Lee et al. "All Graphene-Based Thin Film Transistors on Flexible Plastic Substrates"; Nano Letters, vol. 12, p. 3472-3476; 2012.

B. Dai et al. "A DFT study of hBN compared with graphite in forming alkali metal intercalation compounds"; Materials Chemistry and Physics, vol. 78, p. 304-307; 2002.

\* cited by examiner

MAGNETIC RESISTANCE STRUCTURE, METHOD OF MANUFACTURING THE MAGNETIC RESISTANCE STRUCTURE, AND ELECTRONIC DEVICE INCLUDING THE MAGNETIC RESISTANCE STRUCTURE

RELATED APPLICATIONS

This application claims priority from Korean Patent Application No. 10-2013-0137885, filed on Nov. 13, 2013, in the Korean Intellectual Property Office, the disclosure of which is incorporated herein in its entirety by reference.

BACKGROUND

1. Field

At least one example embodiment relates to a magnetic resistance structure, a method of manufacturing the magnetic resistance structure, and/or an electronic device including the magnetic resistance structure.

2. Description of the Related Art

Graphene is a hexagonal structure that includes a single layer or a plurality of layers formed of carbon atoms, is structurally/chemically stable, and exhibits high electrical/physical characteristics. For example, graphene has a charge mobility of about $2\times10^5$ cm$^2$/Vs that is 100 times or more faster than the charge mobility of silicon (Si), and a current density of about $10^8$ A/cm$^2$ that is 100 times or more higher than the current density of copper (Cu). Thus, graphene has drawn attention as a next-generation material that provides a solution to overcome limitations of the existing devices.

Also, hexagonal boron nitride (hereinafter referred to as 'h-BN') is a material that has a two-dimensional (2D) structure, a hexagonal array of boron atoms and nitrogen atoms, a lattice constant similar to or the same as the lattice constant of graphene, high optical phonon energy, and a very high band gap of about 5.9 eV. Thus, h-BN has drawn attention as a 2D material for high-performance graphene electronic devices.

SUMMARY

At least one example embodiment relates to a magnetic resistance structure being formed using a two-dimensional (2D) layer structure of graphene and hexagonal boron nitride (h-BN), a method of manufacturing the magnetic resistance structure, and an electronic device including the magnetic resistance structure.

Additional example embodiments will be set forth in part in the description which follows and, in part, will be apparent from the description, or may be learned by practice of the example embodiments.

According to at least one example embodiment, a magnetic resistance structure includes a hexagonal boron nitride layer, a first magnetic material layer formed on the boron nitride layer, a non-magnetic layer including graphene and formed on the first magnetic material layer, and a second magnetic material layer formed on the non-magnetic layer.

The non-magnetic layer may be a graphene layer.

The non-magnetic layer may be a graphene oxide insulating layer.

At least one of the first and second magnetic material layers may be formed of a ferromagnetic material.

According to at least one example embodiment, a method of manufacturing a magnetic resistance structure includes forming a hexagonal boron nitride layer, forming a graphene layer on the boron nitride layer, forming a first magnetic material layer between the boron nitride layer and the graphene layer according to an intercalation process, and forming a second magnetic material layer on the graphene layer.

Before the second magnetic material layer is formed, the method may further include forming a graphene oxide insulating layer by oxidizing the graphene layer.

At least one of the first and second magnetic material layers may be formed of a ferromagnetic material.

The boron nitride layer may be formed on a metal substrate.

The metal substrate may be a copper layer or a copper foil.

The method may further include removing the metal substrate.

According to at least one example embodiment, an electronic device using a magnetic resistance structure includes including a magnetic resistance element, wherein a magnetic resistance structure manufactured according to the above method is used as the magnetic resistance element.

According to at least one example embodiment, a memory device includes at least one memory cell including a magnetic resistance element, wherein the magnetic resistance element includes a first magnetic layer and a second magnetic layer spaced apart from each other, and a non-magnetic layer disposed between the first and second magnetic layers, wherein the non-magnetic layer includes a graphene layer or a graphene oxide insulating layer.

At least one of the first and second magnetic material layers may be formed of a ferromagnetic material.

As described above, according to one or more example embodiments, the magnetic resistance structure may be formed by using the 2D layer structure of graphene and hexagonal boron nitride, and forming the magnetic material layer between the graphene layer and the hexagonal boron nitride layer according to an intercalation process.

BRIEF DESCRIPTION OF THE DRAWINGS

These and/or other example embodiments will become apparent and more readily appreciated from the following description, taken in conjunction with the accompanying drawings in which.

DETAILED DESCRIPTION

Figure 1A:
FIGS. 1A to 1E are cross-sectional views illustrating a method of manufacturing a magnetic resistance structure according to at least one example embodiment.

Hereinafter, magnetic resistance structures, method of manufacturing a magnetic resistance structure, and/or an electronic device including a magnetic resistance structure according to various example embodiments will be described in detail with reference to the accompanying drawings. In the drawings, like reference numerals refer to like elements throughout, and the size or thickness of each layer or region may be exaggerated for clarity. The present embodiments may have different forms and should not be construed as being limited to the descriptions set forth herein. Accordingly, the embodiments are merely described below, by referring to the figures, to explain aspects of the present description.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

A magnetic resistance structure according to at least one example embodiment is formed using a two-dimensional (2D) layer structure of hexagonal boron nitride (hereinafter referred to as 'h-BN') and graphene.

Figure 1B:
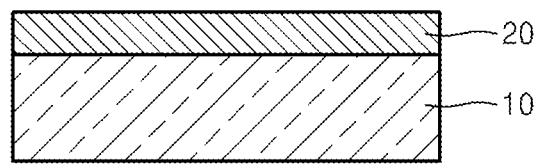
Figure 1C:
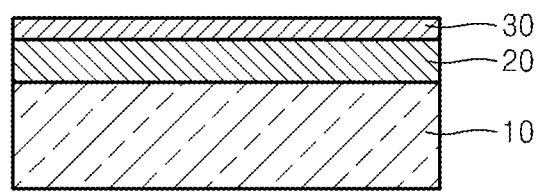
Figure 1D:
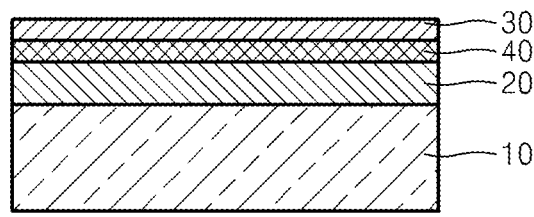
Figure 1E:
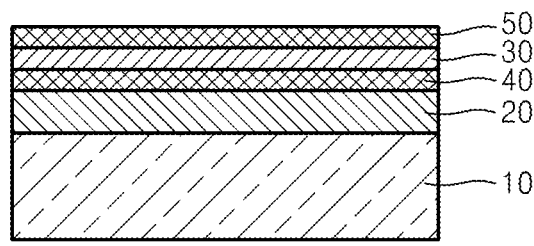

FIGS. 1A to 1E are cross-sectional views illustrating a method of manufacturing a magnetic resistance structure according to at least one example embodiment. FIGS. 1A to 1C illustrate a process of forming a 2D layer structure of h-BN and graphene. The 2D layer structure of h-BN and graphene may be manufactured by chemical vapor deposition. FIGS. 1D and 1E illustrate a process of manufacturing a magnetic resistance structure according to at least one example embodiment by using the 2D layer structure of h-BN and graphene.

First, referring to FIG. 1A, a metal substrate 10 is prepared to form the 2D layer structure of h-BN and graphene.

The metal substrate 10 functions as not only a catalyst for directly growing a h-BN layer 20 thereon but also a support for supporting the grown h-BN layer 20. The metal substrate 10 may include at least one metal from copper (Cu), nickel (Ni), cobalt (Co), iron (Fe), platinum (Pt), palladium (Pd), gold (Au), aluminum (Al), chromium (Cr), magnesium (Mg), manganese (Mn), molybdenum (Mo), rhodium (Rh), silicon (Si), tantalum (Ta), titanium (Ti), tungsten (W), uranium (U), vanadium (V), zirconium (Zr), and an alloy thereof. The metal substrate 10 may be a sheet of a thin or thick film formed of only a metal. The metal substrate 10 may have a thickness of about 1 mm or less, e.g., a thickness of about 10 μm to about 500 μm. For example, the metal substrate 10 may be a copper substrate, e.g., a copper foil.

The surface roughness of the h-BN layer 20 that is directly grown on the metal substrate 10 may be determined by the surface roughness of the metal substrate 10. The h-BN layer 20 grown on the metal substrate 10 having a rough surface also has a rough surface and includes a large amount of impurity particles, thereby degrading the physical properties thereof. Thus, in order to decrease or suppress the degradation of the physical properties of the h-BN layer 20, the metal substrate 10 may be controlled to have a smooth surface before the h-BN layer 20 is formed, so that the h-BN layer 20 formed on the metal substrate 10 may have a low content of impurity particles and a smooth surface.

Next, as illustrated in FIG. 1B, the h-BN layer 20 may be formed on the metal substrate 10. The h-BN layer 20 may be directly grown on the metal substrate 10 by, for example, chemical vapor deposition. The h-BN layer 20 may act as an insulating layer in a magnetic resistance structure according to at least one example embodiment.

The h-BN layer 20 is a 2D planar structure in which a B-N bond is an $sp^2$ covalent bond and interlayer coupling may include Van der Waals bonding. The h-BN layer 20 may be formed to have a large area having a nano-sized thickness.

The may have a thickness of an atomic layer, and have a thickness of a single layer or a multilayer structure including two or more layers. The h-BN layer 20 may have a 2D single/multi-layer structure having a thickness of, for example, 10 nm or less (e.g., 5 nm or less or 2 nm or less). The h-BN layer 20 may have a thickness of, for example, 10 nm or less, and may function as a support that causes a grapheme layer to be directly grown on the h-BN layer 20.

Next, as illustrated in FIG. 1C, a graphene layer 30 is formed on the h-BN layer 20. The graphene layer 30 may be formed by chemical vapor deposition. In the graphene layer 30, a plurality of carbon atoms are arranged on a plane to be connected in a covalent bond (e.g., $sp^2$ bond). The graphene layer 30 may be formed of a single layer of graphene or of a plurality of layers of graphene.

When the h-BN layer 20 is formed on the metal substrate 10 and the graphene layer 30 is formed using the h-BN layer 20 as a base layer as described above, a 2D layer structure of h-BN and graphene may be obtained.

In this case, the 2D layer structure of h-BN and graphene may be manufactured by, for example, chemical vapor deposition. That is, the 2D layer structure of h-BN and graphene may be manufactured by directly growing the h-BN layer 20 on the metal substrate 10 by, for example, chemical vapor deposition, and continuously forming the graphene layer 30 on the h-BN layer 20 by, for example, chemical vapor deposition.

The method of forming the 2D layer structure of h-BN and graphene on the metal substrate 10 will be described in detail below.

The h-BN layer 20 may be directly grown on the metal substrate 10 as will be described below. A first thermal treatment is performed in a chamber to obtain a metal substrate 10 with an increased grain size, and then a second thermal treatment is performed to form the h-BN layer 20 on the metal substrate 10 while a nitrogen source and a boron source are supplied into the chamber in the form of a vapor.

When the metal substrate 10 is thermally treated according to the first thermal treatment process before the h-BN layer 20 is formed, the grain size in the metal substrate 10 may increase, which may improve a surface quality of the h-BN layer 20.

The grain size of the metal substrate 10 may be evaluated according to an average of areas occupied by unit grains of the metal substrate 10. For example, the average of the areas of the unit grains may be calculated by visually calculating the number of grains in a region of an optical photo of a surface of the metal substrate 10, for example, a region of 1 cm×1 cm, and dividing the area by the number of grains. After the first thermal treatment, an average area of the unit grains of the metal substrate 10 may be about 1 $\mu m^2$ or more, e.g., about 1 $\mu m^2$ to about 1 $cm^2$.

For example, the first thermal treatment may be performed in a chamber at high temperature, e.g., about 500° C. to about 3,000° C., for about 10 minutes to about 24 hours. A surface roughness of a catalyst metal decreases as the grain size of the metal substrate 10 is increased through the first thermal treatment. For example, the catalyst metal may have a surface roughness of about 7.0 nm or less, e.g., about 0.01 nm to about 7.0 nm.

During the first thermal treatment, the inside of the chamber may be maintained in an inert atmosphere and/or a reducing atmosphere. The first thermal treatment may be performed at least once, e.g., several times, to further increase the grain size of the metal substrate 10.

According to at least one example embodiment, as a surface control process, the surface of the metal substrate 10 may be more smoothly processed through an additional polishing process after the grain size is increased through the first thermal treatment. In the additional polishing process, at least one of chemical polishing, physical polishing, chemical mechanical polishing, and electrolyte polishing may be used.

The surface roughness of the metal substrate 10 having the grain size being increased through the first thermal treatment may be reduced by causing the surface of the metal substrate 10 to be more smoothly processed using the additional polishing process. As the surface of the metal substrate 10 becomes smoother through the additional polishing process, the surface roughness of the metal substrate 10 may be further reduced. For example, the metal substrate 10 may have a surface roughness of about 5.0 nm or less, e.g., about 0.01 nm to about 5.0 nm.

The size and shape of the h-BN layer 20 formed on the metal substrate 10 may be determined by the size and shape of the metal substrate 10. The size of the metal substrate 10 may be controlled to obtain the h-BN layer 20 having a large area. For example, at least one of the width and length of the metal substrate 10 may be 1 cm or more and may be 1 m or more. Otherwise, the metal substrate 10 may have an area of about 1 $cm^2$ or more. For example, the metal substrate 10 may have an area of about 1 $cm^2$ to about 1 $m^2$.

When the metal substrate 10 is formed in a predetermined pattern, the h-BN layer 20 formed on the metal substrate 10 may have the same pattern as the metal substrate 10.

As described above, the h-BN layer 20 having a high quality and a large area may be formed by performing the second thermal treatment on the metal substrate 10, which the surface is processed using the first thermal treatment and the additional polishing process while supplying a nitrogen source and a boron source as a vapor into the chamber.

The type of nitrogen source is not particularly limited, provided that nitrogen atoms are supplied in a vapor state, and may include at least one of $NH_3$, $N_2$, etc.

The boron source is not particularly limited, provided that boron atoms are supplied in a vapor state, and may include at least one of $BH_3$, $BF_3$, $BCl_3$, $B_2H_6$, $(CH_3CH_2)_3B$, $(CH_3)_3B$, diborane, etc.

At least one of $(H_3NBH_3)$, borazine $((BH)_3(NH)_3)$, etc. may be used as a source that supplies both nitrogen and boron.

The nitrogen source and the boron source may be supplied in a vapor state into the chamber, but the source material itself does not have to be in the vapor state, and a nitrogen-containing material and a boron-containing material in a solid state may be vaporized in an external container.

The nitrogen source and the boron source in the vapor state that are vaporized in the external container may be supplied into the chamber together with nitrogen gas. In this case, the contents of nitrogen and boron to be supplied into the chamber may be controlled by appropriately controlling the temperature of the external container and the flow rate of the nitrogen gas, thereby controlling the growth of h-BN obtained accordingly.

An ammonia-borane ($NH_3$-$BH_3$) compound may be used as a solid-state nitrogen and boron-containing compound stored in the external container. The ammonia-borane ($NH_3$-$BH_3$) compound is vaporized, for example, at about 130° C. and the amounts of $NH_3$ and $BH_3$ to be vaporized may be appropriately controlled by controlling the temperatures of the external container.

The nitrogen source and the boron source of the vapor state may be supplied into a reaction container at a predetermined flow rate. For example, the nitrogen source and the boron source may be supplied stoichiometrically at a ratio of about 1:1, e.g., at a flow rate of about 1 sccm to about 100 sccm.

According to at least one example embodiment, the nitrogen source and the boron source may be supplied in an inert atmosphere and/or a reducing atmosphere. The inert atmosphere may include an inert gas such as nitrogen gas, argon gas, and/or helium gas, and the reducing atmosphere may be include, for example, hydrogen gas. Furthermore, an inert gas and hydrogen gas may be supplied together in the form of a mixture gas. For example, the inert gas may be supplied into the reaction container at a flow rate of about 100 sccm to about 1000 sccm, for example, a flow rate of about 300 sccm to about 700 sccm. For example, the hydrogen gas may be supplied into the reaction container at a flow rate of about 100 sccm to about 1000 sccm, for example, a flow rate of about 300 sccm to about 700 sccm.

The second thermal treatment may be performed at an appropriate temperature for a desired (or alternatively predetermined) time to grow the h-BN layer 20 on the metal substrate 10. For example, the second thermal treatment may be performed for about one minute to about two hours at about 700° C. to about 1,200° C., for example, at about 700° C. to a temperature of a melting point of the melting substrate 10. According to at least one example embodiment, a cooling process is performed on a resultant output obtained using the second thermal treatment. The cooling process is performed to evenly grow and uniformly arrange h-BN. For example, the resultant output may be cooled at a speed of about 10° C. to about 100° C. per minute. To this end, an inert gas such as nitrogen gas may be supplied at a constant flow rate. Otherwise, the resultant output may be naturally cooled, or cooled at equilibrium in the chamber. The resultant output may be naturally cooled by stopping an operation of a heat source or removing the heat source from the chamber.

The h-BN layer 20 after the cooling process is performed may be formed to a thickness of an atomic layer and may have a single-layer structure or a multilayer structure including two or more layers. When the h-BN layer 20 has a multilayer structure, for example, the h-BN layer 20 may have a multilayer structure including layers stacked to a thickness of about 10 nm or less, e.g., a thickness of about 5 nm or less or a thickness of about 2 nm or less.

As described above, the h-BN layer 20 that is directly grown on the metal substrate 10 is supplied into the chamber, and the temperature of the chamber is raised to a range of about 300° C. to about 1500° C. An atmosphere in which the graphene layer 30 is grown in the range of about 300° C. to about 1500° C. without damaging the metal substrate 10 and the h-BN layer 20 may be formed in the chamber.

A heat source used to raise the temperature of the chamber and perform a thermal treatment thereafter may use induction heating, a radiant heat, laser, infrared (IR) rays, microwaves, plasma waves, ultraviolet (UV) radiation, surface plasmon heating, etc. without limitations. The heat source may be attached to the chamber so that the inside of the chamber may be raised to a desired (or alternatively predetermined) temperature and maintained constant at the desired temperature.

Then, the graphene layer 30 is formed on the h-BN layer 20 by thermally processing with maintaining the desired temperature while supplying the carbon source as a vapor into the chamber.

The type of carbon source is not particularly limited as long as the carbon source may provide carbon and may be in a vapor state at a temperature of 300° C. or more. Any type of a carbon-containing compound may be used as the carbon source in a vapor state. For example, at least one of carbon monoxide, methane, ethane, ethylene, ethanol, acetylene, propane, propylene, butane, butadiene, pentane, pentene, cyclopentadiene, hexane, cyclohexane, benzene, and toluene may be used as the carbon source.

The carbon source may be supplied under a constant pressure into the chamber in which the metal substrate 10 on which the h-BN layer 20 is grown is present, and may be supplied at a flow rate of about 1 sccm to about 100 sccm.

The carbon source may be supplied into the chamber in an inert atmosphere and/or a reducing atmosphere. The inert atmosphere may include an inert gas such as nitrogen gas, argon gas, or helium gas. The reducing atmosphere may be formed using hydrogen gas. Hydrogen may be used to control a vapor reaction by maintaining a surface of a metal catalyst clean.

An inert gas and hydrogen gas may be supplied as the carbon source together in the form of a mixture gas. For example, the inert gas may be supplied into the chamber at a flow rate of about 100 sccm to about 1000 sccm, for example, a flow rate of about 300 sccm to about 700 sccm. The hydrogen gas may be supplied into the chamber at a flow rate of about 100 sccm to about 1000 sccm, for example, a flow rate of about 300 sccm to about 700 sccm.

According to at least one example embodiment, the graphene layer 30 may be formed on the h-BN layer 20 by thermal treatment for maintaining the temperature range of about 300° C. to about 1500° C. while supplying the carbon source in a vapor state into the chamber. The thermal treatment may be performed while maintaining an increased temperature in the range of about 300° C. to about 1500° C. For example, the thermal treatment may be performed in a range of about 500° C. to about 1000° C. The thermal treatment when the metal substrate 10 is a thick film may be performed at a higher temperature than when the metal substrate 10 is a thin film.

A degree to which the graphene layer 30 is formed may be controlled by performing the thermal treatment for a predetermined time. That is, a duration for which the thermal treatment is continuously performed may be controlled to form a desired graphene layer, for example, a graphene layer of a single layer. The thermal treatment may be continuously performed for about 10 minutes to about 100 hours.

A cooling process may be performed on a resultant output formed through the thermal treatment. The cooling process may facilitate evenly growing graphene and arranging the graphene on a 2D plane in a regular pattern. When the resultant output is rapidly cooled, the graphene layer 30 may form cracks. Thus, the resultant output may have to be slowly cooled at a constant cooling rate as much as possible. For example, the resultant output may be cooled at a cooling rate of about 0.1° C. to about 10° C. per minute, or may be naturally cooled in the chamber. The resultant output may be naturally cooled in the chamber by simply removing a heat source used to perform the thermal treatment. By simply removing the heat source, the resultant output may be cooled at an appropriate cooling rate. The thermal treatment and the cooling process described above may be performed in one cycle but the graphene layer 30 may be formed in a fine structure by repeatedly performing the thermal treatment and the cooling process several times.

The graphene layer 30 obtained after performing the thermal treatment may have a single-layer structure or a multi-layer structure.

The graphene layer 30 may be easily controlled to have a large area by adjusting the sizes of the metal substrate 10 and the h-BN layer 20. For example, at least one of the width and length of the graphene layer 30 may be adjusted to be 1 cm or more and to be 1 m or more in maximum.

According to at least one example embodiment, introduction of impurities into an interface between a h-BN sheet and a graphene sheet, which may occur during a transfer process, may be suppressed as much as possible in the 2D layer structure including h-BN and graphene obtained by continuously forming the graphene layer 30 on the h-BN layer 20 (which is directly formed on the metal substrate 10 by chemical vapor deposition) by, for example, chemical vapor deposition, compared to when a graphene sheet is formed on a h-BN sheet by a mechanical transfer process. Accordingly, a high-quality 2D layer structure having few defects may be obtained.

According to at least one example embodiment, after the 2D layer structure including h-BN and graphene is formed as described above, a first magnetic material layer 40 is formed between the h-BN layer 20 and the graphene layer 30 as illustrated in FIG. 1D.

The first magnetic material layer 40 may be formed between the h-BN layer 20 and the graphene layer 30 according to an intercalation process.

For example, the intercalation process may be performed in a tube including two bulbs, which are formed to have different temperatures and to be passed through each other, in a chlorine atmosphere. In this case, the intercalation process may be performed in a state in which the 2D layer structure including h-BN and graphene is placed in one of the two bulbs and a source material of the first magnetic material layer 40 is placed in the other bulb.

During the intercalation process, the first magnetic material layer 40 may be formed between the h-BN layer 20 and the graphene layer 30, and the h-BN layer 20 and the graphene layer 30 are not chemically bonded to each other.

The first magnetic material layer 40 may be formed of, for example, a ferromagnetic material. For example, the first magnetic material layer 40 may be formed of at least one ferromagnetic material such as one of Fe, Co, CoFe, and CoFeB.

Then, as illustrated in FIG. 1E, a second magnetic material layer 50 may be formed by depositing a magnetic material on the graphene layer 30, according to at least one example embodiment. The second magnetic material layer 50 may be formed of a ferromagnetic material, similar to or the same as the first magnetic material layer 40. For example, the second magnetic material layer 50 may be formed of at least one ferromagnetic material such as one of Fe, Co, CoFe, and CoFeB.

According to at least one example embodiment, the metal substrate 10 may be removed after a stack structure including the second magnetic material layer 50, the graphene layer 30, the first magnetic material layer 40, and the h-BN layer 20 is formed on the metal substrate 10 as described above. A magnetic resistance structure including the second magnetic material layer 50, the graphene layer 30, the first magnetic material layer 40, and the h-BN layer 20, which acts as an insulating layer, as illustrated in FIG. 2 may be formed according to the example processes described above with reference to FIGS. 1A to 1E.

Figure 2:
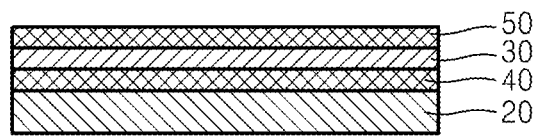
FIG. 2 is a schematic cross-sectional view of a magnetic resistance structure according to at least one example embodiment.

Referring to FIG. 2, a magnetic resistance structure according to at least one example embodiment includes a h-BN layer 20, a first magnetic material layer 40 formed on the h-BN layer 20, a non-magnetic layer 30 including graphene and formed on the first magnetic material layer 40, and a second magnetic material layer 50 formed on the non-magnetic layer 30. The non-magnetic layer 30 may correspond to the graphene layer 30.

A magnetic resistance structure according to an example embodiment illustrated in FIG. 2 may exhibit, for example, large magnetoresistance (GMR) characteristics.

Figure 3A:
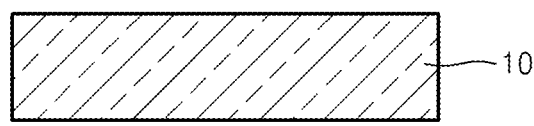
FIGS. 3A to 3F are cross-sectional views illustrating a method of manufacturing a magnetic resistance structure according to at least one example embodiment.
Figure 3B:
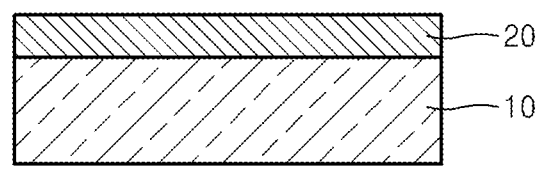
Figure 3C:
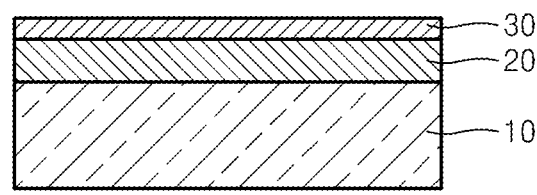
Figure 3D:
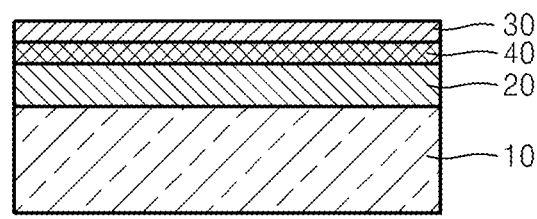
Figure 3E:
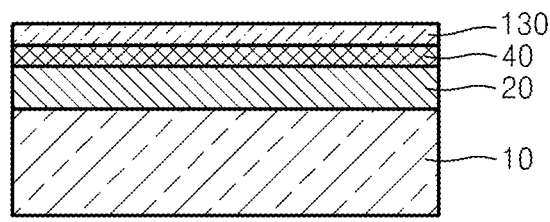
Figure 3F:
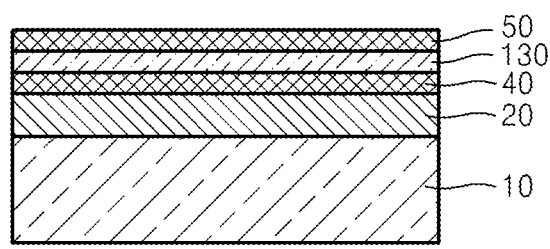

FIGS. 3A to 3F are cross-sectional views illustrating a method of manufacturing a magnetic resistance structure according to at least one example embodiment. FIGS. 3A to 3C illustrate a process of forming a 2D layer structure including h-BN and graphene, similarly to FIGS. 1A to 1C. The 2D layer structure including h-BN and graphene may be manufactured by, for example, chemical vapor deposition. FIGS. 3D to 3F illustrate a process of manufacturing a magnetic resistance structure according to another example embodiment by using the 2D layer structure including h-BN and graphene.

Referring to FIGS. 3A to 3C, in order to manufacture the 2D layer structure including h-BN and graphene, a metal substrate 10 is prepared, a h-BN layer 20 is directly grown on the metal substrate 10 by chemical vapor deposition, and a graphene layer 30 is formed on the h-BN layer 20 by, for example, chemical vapor deposition. The process of manufacturing the 2D layer structure including h-BN and graphene may be substantially the same as the example process described above with reference to FIGS. 1A to 1C and is thus not redundantly described here.

After the 2D layer structure including h-BN and graphene is formed as described above, a first magnetic material layer 40 is formed between the h-BN layer 20 and the graphene layer 30 as illustrated in FIG. 3D.

The first magnetic material layer 40 may be formed between the h-BN layer 20 and the graphene layer 30 according to the intercalation process. The intercalation process may be performed in various ways.

For example, the intercalation process may be performed in a tube including two bulbs, which are formed to have different temperatures and to be passed through each other, in a chlorine atmosphere. In this case, the intercalation process may be performed in a state in which the 2D layer structure including h-BN and graphene is placed in one of the two bulbs and a source material of the first magnetic material layer 40 is placed in the other bulb.

During the intercalation process, the first magnetic material layer 40 may be formed between the h-BN layer 20 and the graphene layer 30 that are not chemically bonded to each other.

The first magnetic material layer 40 may be formed of, for example, a ferromagnetic material. For example, the first magnetic material layer 40 may be formed of at least one ferromagnetic material such as one of Fe, Co, CoFe, and CoFeB.

According to at least one example embodiment, as illustrated in FIG. 3E, the graphene layer 30 may be changed into a graphene oxide (GO) insulating layer 130 by performing an oxidization process on the graphene layer 30 in a state in which first magnetic material layer 40 is formed between the b-BN layer 20 and the graphene layer 30.

For example, the GO insulating layer 130 may be formed by causing the graphene layer 30 to be naturally oxidized at room temperature, similarly to a method of obtaining $SiO_2$ through natural oxidization.

Then, as illustrated in FIG. 3F, a second magnetic material layer 50 may be formed by depositing a magnetic material on the GO insulating layer 130. The second magnetic material layer 50 may be formed of a ferromagnetic material, similar to or the same as the first magnetic material layer 40. For example, the second magnetic material layer 50 may be formed of at least one ferromagnetic material such as one of Fe, Co, CoFe, and CoFeB.

As described above, the metal substrate 10 may be removed after a stack structure including the second magnetic material layer 50, the GO insulating layer 130, the first magnetic material layer 40, and the h-BN layer 20 is formed on the metal substrate 10.

Figure 4:
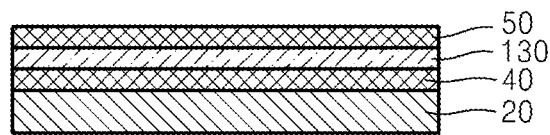
FIG. 4 is a schematic cross-sectional view of a magnetic resistance structure according to at least one example embodiment.

A magnetic resistance structure including the second magnetic material layer 50, the GO insulating layer 130, the first magnetic material layer 40, and the h-BN layer 20 as illustrated in FIG. 4 may be formed according to the example processes described above with reference to FIGS. 3A to 3F.

Referring to FIG. 4, a magnetic resistance structure according to at least one example embodiment includes a h-BN layer 20, a first magnetic material layer 40 formed on the h-BN layer 20, a non-magnetic layer including graphene and formed on the first magnetic material layer 40, and a second magnetic material layer 50 formed on the non-magnetic layer. The non-magnetic layer may correspond to the GO insulating layer 130.

A magnetic resistance structure according to another example embodiment as illustrated in FIG. 4 may exhibit, for example, tunnel magnetoresistance (TMR) characteristics.

Methods of manufacturing a magnetic resistance structure and magnetic resistance structures according to various example embodiments as described above may be applied to various electronic devices that have a magnetic resistance structure including a ferromagnetic layer, a non-magnetic layer, and a ferromagnetic layer.

For example, magnetic resistance structures according to various example embodiments may be applied to various electronic devices such as a memory device, a magnetic sensor, a magnetic head, etc.

Figure 5:
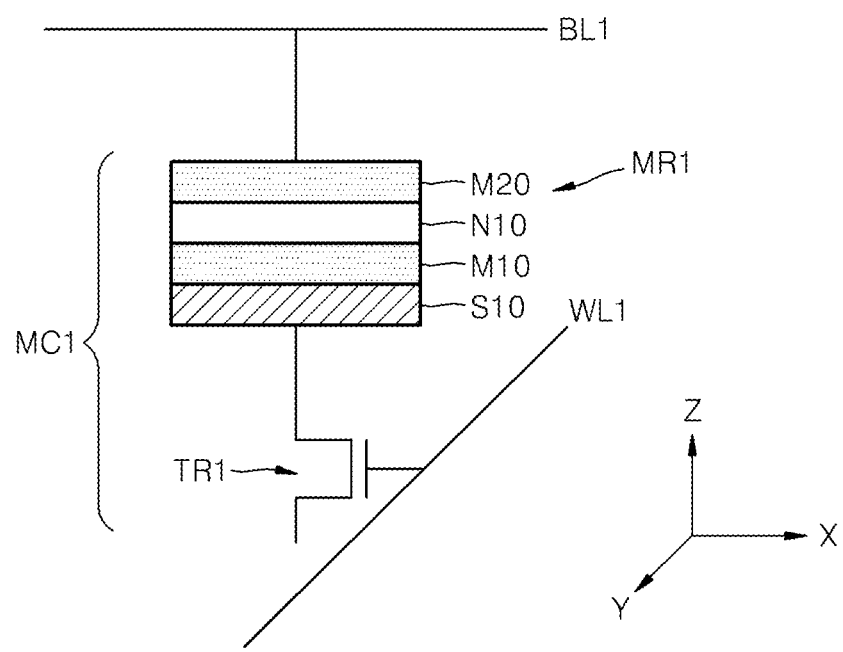
FIG. 5 schematically illustrates a memory device as an example of an electronic device to which a magnetic resistance structure according to at least one example embodiment is applied.

FIG. 5 schematically illustrates a memory device as an example of an electronic device to which a magnetic resistance structure according to an example embodiment is applied.

Referring to FIG. 5, the memory device according to the example embodiment may include a memory cell MC1 including a magnetic resistance element MR1 and a switching element TR1 connected to the magnetic resistance element MR1. The magnetic resistance element MR1 may include a magnetic resistance structure as described above with reference to FIG. 2 or 4.

Referring to FIGS. 2, 4, and 5, a layer S10 may correspond to the h-BN layer 20, first and second magnetic layers M10 and M20 may correspond to the first and second magnetic material layers 40 and 50, and a non-magnetic layer N10 may correspond to the graphene layer 30 or the GO insulating layer 130. The layer S10 corresponding to the h-BN layer 20 may be omitted if necessary.

In the example magnetic resistance element MR1, one of the first or second magnetic layer M10 and M20, e.g., the first magnetic layer M10, may be a free layer and the other, e.g., the second magnetic layer M20, may be a fixed layer.

The non-magnetic layer N10 may be the graphene layer 30 or the GO insulating layer 130. The memory device may exhibit GMR characteristics when the non-magnetic layer N10 is the graphene layer 30 and may exhibit TMR characteristics when the non-magnetic layer N10 is the GO insulating layer 130.

The switching element TR1 may be, for example, a transistor. The switching element TR1 may be electrically connected to the first magnetic layer M10 of the magnetic resistance element MR1.

The memory cell MC1 may be connected between a bit line BL1 and a word line WL1. The bit line BL1 and the word line WL1 may be formed to intersect each other, and the memory cell MC1 may be located at an intersection of the bit line BL1 and the word line WL1. The bit line BL1 may be connected to the magnetic resistance element MR1. The second magnetic layer M20 of the magnetic resistance element MR1 may be electrically connected to the bit line BL1. The word line WL1 may be connected to the switching element TR1. When the switching element TR1 is a transistor, the word line WL1 may be connected to a gate electrode of the switching element TR1. A write/read/erase current may be applied to the memory cell MC1 via the word line WL1 and the bit line BL1.

Although FIG. 5 illustrates one example memory cell MC1, a plurality of memory cells MC1 may be formed in an array. That is, a plurality of bit lines BL1 and a plurality of word lines WL1 may be arranged to intersect with one another, and the plurality of memory cells MC1 may be located at intersections of the plurality of bit lines BL1 and the plurality of word lines WL1.

It should be understood that the example embodiments described therein should be considered in a descriptive sense only and not for purposes of limitation. Descriptions of features within each example embodiment should typically be considered as available for other similar features in other example embodiments.

While one or more example embodiments have been described with reference to the figures, it will be understood by those of ordinary skill in the art that various changes in form and details may be made therein without departing from the spirit and scope of the example embodiments as defined by the following claims.

What is claimed is:

1. A magnetic resistance structure comprising:
    a hexagonal boron nitride layer;
    a first magnetic material layer on the boron nitride layer;
    a non-magnetic layer including a graphene oxide insulating layer on the first magnetic material layer; and
    a second magnetic material layer on the non-magnetic layer.

2. The magnetic resistance structure of claim 1, wherein at least one of the first and second magnetic material layers comprises a ferromagnetic material.

3. The magnetic resistance structure of claim 1, wherein at least one of the first and second magnetic material layers comprises a ferromagnetic material.

4. A method of manufacturing a magnetic resistance structure, the method comprising:
    forming a hexagonal boron nitride layer;
    forming a graphene layer on the boron nitride layer;
    forming a first magnetic material layer between the boron nitride layer and the graphene layer via an intercalation process;
    forming a graphene oxide insulating layer by oxidizing the graphene layer; and
    forming a second magnetic material layer on the graphene oxide insulating layer.

5. The method of claim 4, wherein at least one of forming the first magnetic material layer and forming the second magnetic material layer comprises forming a ferromagnetic material.

6. The method of claim 4, wherein at least one of forming the first magnetic material layer and forming the second magnetic material layer comprises forming a ferromagnetic material.

7. The method of claim 4, wherein the hexagonal boron nitride layer is formed on a metal substrate.

8. The method of claim 7, wherein the metal substrate comprises a copper layer or a copper foil.

9. The method of claim 7, further comprising removing the metal substrate.

10. An electronic device comprising:
   a magnetic resistance structure manufactured according to the method of claim 4.

11. The electronic device of claim 10, wherein at least one of the first and second magnetic material layers comprises a ferromagnetic material.

12. The electronic device of claim 10, wherein the hexagonal boron nitride layer is on a metal substrate.

13. The electronic device of claim 12, wherein the metal substrate comprises a copper layer or a copper foil.

14. A memory device comprising at least one memory cell including a magnetic resistance element,
   wherein the magnetic resistance element comprises:
   a first magnetic layer and a second magnetic layer; and
   a non-magnetic layer between the first and second magnetic layers,
   wherein the non-magnetic layer comprises a graphene oxide insulating layer.

15. The memory device of claim 14, wherein at least one of the first and second magnetic material layers comprises a ferromagnetic material.

\* \* \* \* \*